United States Patent
Ho et al.

(10) Patent No.: US 7,286,066 B1
(45) Date of Patent: Oct. 23, 2007

(54) ACCELERATION OF BITSTREAM DECODING

(75) Inventors: Yiu Cheong Ho, Fremont, CA (US); Hideo Ohira, Kanagawa (JP); Ignatius B. Tjandrasuwita, Atherton, CA (US); Prahlad R. Venkatapuram, San Jose, CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 11/303,335

(22) Filed: Dec. 16, 2005

(51) Int. Cl.
*H03M 7/40* (2006.01)
(52) U.S. Cl. .......................................... 341/67; 341/50
(58) Field of Classification Search ................ 341/50, 341/65, 67, 68
See application file for complete search history.

(56) References Cited

U.S. PATENT DOCUMENTS

| 5,761,466 A | 6/1998 | Chau |
| 6,507,293 B2 * | 1/2003 | Deeley et al. ................ 341/67 |
| 6,653,955 B1 | 11/2003 | Yang |
| 2004/0143728 A1 * | 7/2004 | Flynn et al. ................ 712/300 |

* cited by examiner

*Primary Examiner*—Brian Young

(57) ABSTRACT

Described are methods and systems for variable length decoding. A first execution unit executes a first single instruction that optionally reverses the order of bits in an encoded bitstream. A second execution unit executes a second single instruction that extracts a specified number of bits from the bitstream produced by the first execution unit. A third execution unit executes a third single instruction that identifies a number of consecutive zero bit values at the head of the bitstream produced by the first execution unit. The outputs of the first, second and third execution units are used in a process that decodes the encoded bitstream.

20 Claims, 6 Drawing Sheets

ACCELERATION OF BITSTREAM DECODING

FIELD OF THE INVENTION

Embodiments of the present invention generally relate to data processing. More specifically, embodiments of the present invention relate to decoding (decompressing) data such as video data.

BACKGROUND ART

The ability to quickly and efficiently process video streams has grown in importance, with portable consumer electronic products incorporating more and more multimedia features. Mobile phones, for example, can be used to retrieve, view and transmit multimedia content. However, while the capabilities of portable devices continue to increase, such devices are still somewhat limited relative to more powerful platforms such as personal computers. Data transmission and retrieval rates may also be a factor. The amount of image (e.g., video) data is usually more of a consideration than the amount of audio data.

The data is often encoded (compressed) to facilitate storage and streaming, and then decoded (decompressed) for playback (e.g., display). Video data may be compressed using a Moving Pictures Experts Group (MPEG) scheme, for example. In a compression scheme such as MPEG, the raw or original data is encoded as motion vectors, discrete cosine transform (DCT) coefficients, texture coefficients, and so on. Methods such as Huffman coding are applied to the encoded data to transform the encoded values into predefined variable length codes (VLCs), which are then serialized in a bitstream. An N-bit encoded value can be represented as an M-bit VLC, where M is less than N, thus shortening the length of the bitstream. Shorter VLCs are used to represent the values that occur most frequently in the encoded data to further reduce the length of the bitstream.

The VLCs are not separated or otherwise delineated in the encoded bitstream, but are defined in such a way that they can be unambiguously decoded using a variable length decoder (VLD). Typically, to interpret the encoded bitstream, the VLD relies on a table of VLCs implemented as a lookup table (LUT). In general, the VLD parses the encoded bitstream to identify a VLC that is in the LUT, and then shifts the input bitstream by the length of the VLC to identify the next VLC. More specifically, in essence the VLD looks at the first bit in the bitstream to see if it matches an entry in the LUT; if not, it looks at the first two bits to see if they match an LUT entry; and so on, until a match is made. Having thus interpreted a certain number of bits, the VLD can then shift the bitstream by that number of bits and repeat the process.

There are advantages associated with improving the performance of a VLD. For instance, by accelerating VLD performance, processing speeds can be increased, perhaps improving video quality. Alternatively, with a faster VLD, current levels of performance can be maintained using fewer processor cycles, perhaps saving power or allowing additional applications to be executed simultaneously.

SUMMARY OF THE INVENTION

Accordingly, a system and/or method that can accelerate VLD performance would be advantageous. Embodiments in accordance with the present invention provide these and other advantages.

In one embodiment, VLD functions or operations are implemented using a configurable processor that incorporates a number of execution units. Each execution unit performs an operation using a specific, single instruction. In one such embodiment, a first execution unit executes a first single instruction that optionally reverses the order of bits in an encoded bitstream to match the endian mode used by the VLD; a second execution unit executes a second single instruction that extracts a specified number of bits from the bitstream produced by the first execution unit; and a third execution unit executes a third single instruction that identifies a number of consecutive zero bit values at the head of the bitstream produced by the first execution unit. In one embodiment, the first single instruction operates on segments of the encoded bitstream, reversing the order of the bits in each segment. In another embodiment, the first single instruction also removes stuffing code from the encoded bitstream. In yet another embodiment, the first, second and third single instructions are executed in a single clock cycle each.

The outputs of the first, second and third execution units are used as part of subsequent processes to decode the encoded bitstream. In one embodiment, a processor uses the outputs to index a codeword (e.g., a VLC) in an LUT in order to translate the codeword. That is, for example, if a texture coefficient is represented as an N-bit string that is encoded as an M-bit VLC (M is less than N), which in turn is serialized in an encoded bitstream, then the outputs of the first, second and third execution units allow the processor to parse the encoded bitstream to extract the VLC and find the VLC in the LUT, in order to interpret the VLC and translate it back to the N-bit value of the texture coefficient.

In one embodiment, the VLD includes a fourth execution unit that reads, in a single clock cycle, a specified number of bits from the bitstream produced by the first execution unit, and uses those bits to look up a memory address in a lookup table. The memory address in turn is used to locate a decoded (translated) codeword.

To summarize, relatively complex tasks are performed in a VLD using one instruction per task instead of multiple instructions per task. As a result, the number of execution (processor) cycles needed for variable length decoding can be substantially reduced. Indeed, reductions of 35 to 50 percent have been realized.

These and other objects and advantages of the various embodiments of the present invention will be recognized by those of ordinary skill in the art after reading the following detailed description of the embodiments that are illustrated in the various drawing figures.

BRIEF DESCRIPTION OF THE DRAWINGS

The accompanying drawings, which are incorporated in and form a part of this specification, illustrate embodiments of the present invention and, together with the description, serve to explain the principles of the invention.

DETAILED DESCRIPTION OF THE INVENTION

Figure 1:
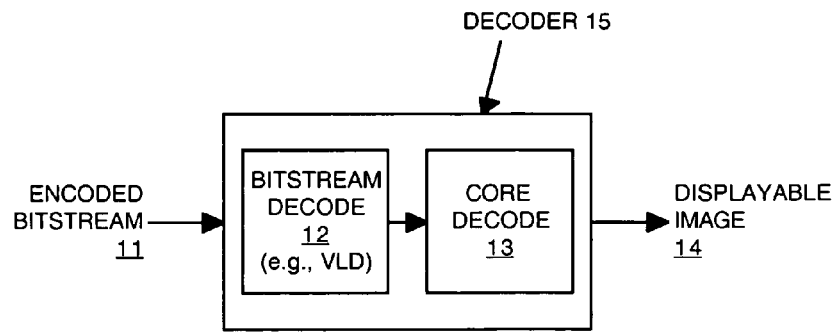
FIG. 1 is a block diagram showing elements of a decoder according to one embodiment of the present invention.

Reference will now be made in detail to the various embodiments of the present invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be understood that the present invention may be practiced without these specific details. In other instances, well-known methods, procedures, components, and circuits have not been described in detail so as not to unnecessarily obscure aspects of the present invention.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "executing," "receiving," "reversing," "extracting," "identifying," "decoding," "encoding," "removing," "shifting," "storing," "selecting" or the like, refer to actions and processes (e.g., flowchart 70 of FIG. 7) of a computer system or similar electronic computing device or processor. The computer system or similar electronic computing device manipulates and transforms data represented as physical (electronic) quantities within the computer system memories, registers or other such information storage, transmission or display devices.

The descriptions and examples provided herein are discussed in the context of video data; however, the present invention is not so limited. In general, the present invention, in its various embodiments, is well-suited for use with still-image data, Web page-based data, graphic data and the like, and combinations thereof. The data may be multimedia data; for example, there may be audio data associated with the video data.

Embodiments in accordance with the present invention are well-suited for use with a variety of encoding schemes. For example, the data may be compressed using Moving Pictures Experts Group (MPEG) compression (encoding) schemes such as, but not limited to, MPEG-1, MPEG-2 and MPEG-4; International Telecommunication Union (ITU) encoding schemes such as, but not limited to, H.261, H.263 and H.264; or Joint Photographic Experts Group (JPEG) encoding schemes.

FIG. 1 is a block diagram showing elements of a decoder 15 according to one embodiment of the present invention. In general, decoder 15 receives an encoded bitstream 11, decodes the data in the bitstream 11, and produces displayable image data 14.

In general, in one embodiment, raw image data (e.g., video data) is compressed using some type of compression scheme to generate a set of encoding parameters such as, but not limited to, frame type (e.g., P-frame, I-frame or B-frame), macroblock prediction mode (e.g., inter-block versus intra-block), discrete cosine transform (DCT) coefficients, texture coefficients, and motion vector information. The encoding parameters are then translated into variable length codes (VLCs), using Huffman coding for example. The encoded bitstream 11 is a serialized bitstream containing the VLCs.

Decoder 15 essentially reverses the encoding process to reconstruct the image data. In the example of FIG. 1, the decoder 15 includes a bitstream decode block 12 and a core decode block 13. Bitstream decode block 12 includes a variable length decoder (VLD), and hereinafter the decode block 12 is referred to as VLD 12. In general, VLD 12 parses the encoded bitstream 11 to extract the VLCs, and then translates the VLCs to reproduce the encoding parameters referred to above. The encoding parameters are in turn used by the core decode block 13 to reconstruct the original video data (more specifically, a version of the original video data is reconstructed).

Figure 2:
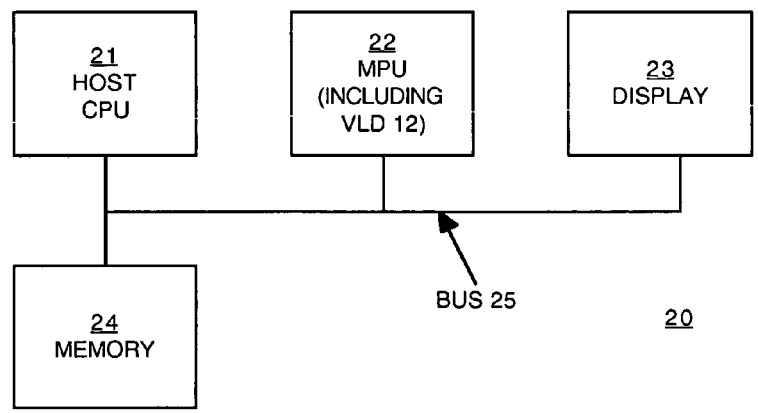
FIG. 2 is a block diagram of one embodiment of a system that includes a variable length decoder in accordance with the present invention.

FIG. 2 is a block diagram of a system 20 upon which a VLD 12 in accordance with the present invention can be implemented. In the example of FIG. 2, the system 20 includes a host central processing unit (CPU) 21 coupled to a media processor unit (MPU) 22 via a bus 25. Both the CPU 21 and the MPU 22 are coupled to a memory 24 via bus 25. In the system 20 embodiment, the memory 24 is a shared memory, whereby the memory 24 stores instructions and data for both the CPU 21 and the MPU 22. Alternatively, there may be separate memories dedicated to the CPU 21 and MPU 22, respectively. The memory 24 can also include a video frame buffer for storing pixel data that drives a coupled display 23.

As shown in FIG. 2, system 20 includes the basic components of a computer system platform that implements functionality in accordance with embodiments of the present invention. System 20 can be implemented as, for example, a number of different types of portable handheld electronic devices. Such devices can include, for example, portable phones, personal digital assistants (PDAs), handheld gaming devices, or virtually any other type of device with display capability. In such embodiments, components can be included that are designed to add peripheral buses, specialized communications components, support for specialized input/output (I/O) devices, and the like.

Figure 3A:
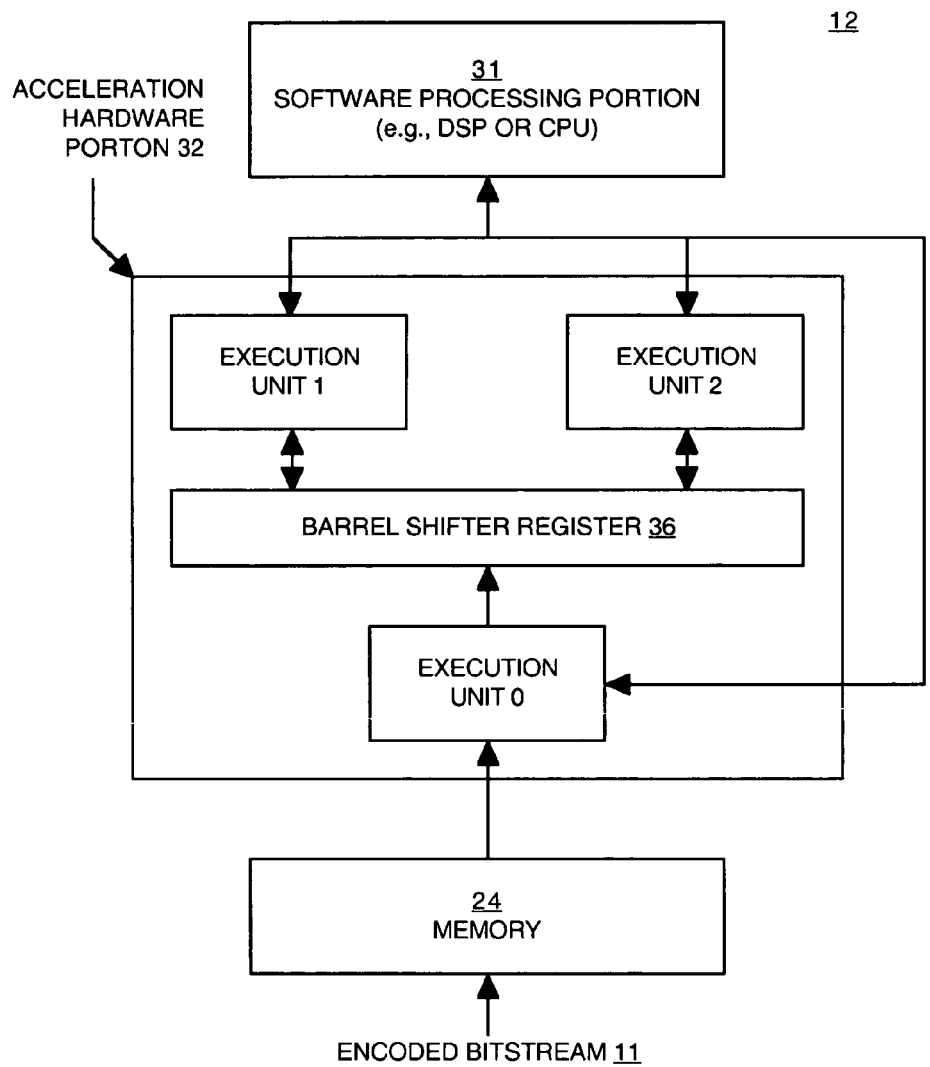
FIG. 3A is a block diagram of a system for variable length decoding according to one embodiment of the present invention.

FIG. 3A is a block diagram of a VLD 12 according to one embodiment of the present invention. In the example of FIG. 3A, VLD 12 includes a software processing portion 31 and an acceleration hardware portion 32.

The acceleration hardware portion 32 parses the encoded bitstream 11 and extracts information that in turn is used by the software processing portion 31 to interpret the encoded bitstream 11. In combination, the software processing portion 31 and the acceleration hardware portion 32 accomplish the VLD functions described above.

In one embodiment, the software processing portion 31 includes a CPU or a digital signal processor (DSP), and the acceleration hardware portion 32 is implemented using a configurable processor. In general, a configurable processor is a processor having instruction sets and an architecture that can be modified and extended to provide customized functionality. A configurable processor utilizes register transfer level (RTL) code implemented on a system-on-a-chip (SOC), a field programmable gate array (FPGA), or the like.

In the present embodiment, all of or a portion of the encoded bitstream 11 is buffered in memory 24. As will be seen, the acceleration hardware portion 32 extracts certain information from the encoded bitstream 11. In the example of FIG. 3A, software processing portion 31 executes a software procedure that uses the extracted information to locate a codeword (e.g., a VLC) in an LUT. The LUT also lists the decoded information that corresponds to the codeword. In other words, the LUT includes decoded information that is indexed using codewords (e.g., VLCs). In one embodiment, the LUT resides in memory 24, and there may be more than one such LUT.

To facilitate lookups in an LUT, the codewords are grouped according to the number of leading zeros. For example, if a codeword is 00011, the number of leading zeros is three (3), and this codeword is grouped with other codewords that have 3 leading zeros. Accordingly, one of the functions of acceleration hardware portion 32 is to determine the number of leading zeros and return that value to software processing portion 31.

Another function of acceleration hardware portion 32 is to read (or "get") the values of the bits in the encoded bitstream 11—the value of a first VLC—and then remove those bits from the bitstream so that the next VLC can be extracted.

In some cases, the encoded bitstream 11 will include stuffing information in order to prevent special codeword emulation. Accordingly, yet another function of the acceleration hardware portion 32 is to remove stuffing code from the encoded bitstream 11.

Furthermore, the encoded bitstream 11 and the decoder 15 (FIG. 1) should use the same endian mode (e.g., little endian versus big endian). If the bit (or byte) ordering in the encoded bitstream 11 is different from that expected by decoder 15, then another function of the accelerated hardware portion 32 of FIG. 3A is to swap the order of the data.

To perform the functions described above, acceleration hardware portion 32 includes three execution (or logic) units 0, 1 and 2, as well as barrel shifter register 36. As used herein, an execution unit is a element that performs an instruction invoked by software processing portion 31—an execution unit receives data and operates on that data. As used herein, a barrel shifter register is a combinational logic device or circuit that can shift data by any number of bits in a single operation.

The execution units 0, 1 and 2 and the barrel shifter register 36 are described more fully in conjunction with FIGS. 4, 5 and 6, below. In general, according to embodiments of the present invention, each of the execution units 0, 1 and 2 executes a single instruction. Furthermore, according to embodiments of the present invention, each of the instructions accomplishes, in a single clock cycle, one or more of the functions described above.

Figure 3B:
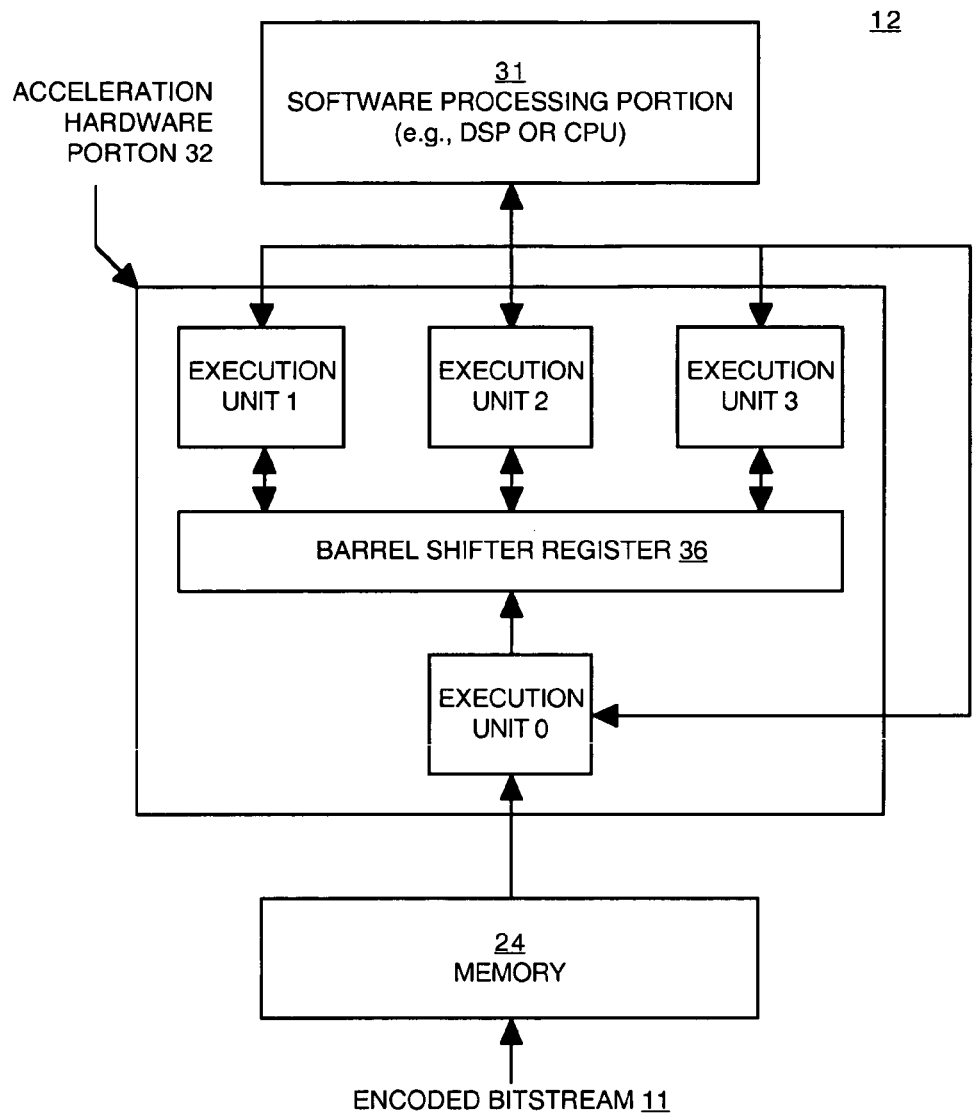
FIG. 3B is a block diagram of a system for variable length decoding according to another embodiment of the present invention.

FIG. 3B is a block diagram of a VLD 12 according to another embodiment of the present invention. In the present embodiment, acceleration hardware portion 32 includes a fourth execution unit 3, which is coupled to the barrel shifter 36. The discussion of FIG. 3A above refers to a software procedure executed by software processing portion 31 that locates a codeword (e.g., a VLC) in an LUT based on information read from the encoded bitstream 11. In the example of FIG. 3B, in certain instances this function is instead performed in hardware by execution unit 3. In particular, in one embodiment, there are three LUTs for texture coefficients (e.g., MPEG-4 intraframe and interframe and H.263 advance intraframe). Rather than containing decoded information indexed using codewords (VLCs), these LUTs contain memory addresses indexed using codewords (VLCs); each memory addresses stores a decoded codeword. Under direction of processor 31, execution unit 3 reads the first K bits from the barrel shifter register 36. Using those bits, execution unit 3 locates an entry (a memory address) in the appropriate LUT, and reads the decoded codeword from that memory location. Thus, in the example of FIG. 3B, instead of locating a decoded codeword in an LUT as in the example of FIG. 3A, an address is located in an LUT, and that address is used to locate the decoded codeword.

Execution unit 3 performs the lookup in a single processor (clock) cycle. That is, execution unit 3 locates the memory address and returns that address in a single cycle. Because the lookup is performed in hardware using execution unit 3, the processor 31 does not expend cycles executing a software-based search of an LUT.

Figure 4:
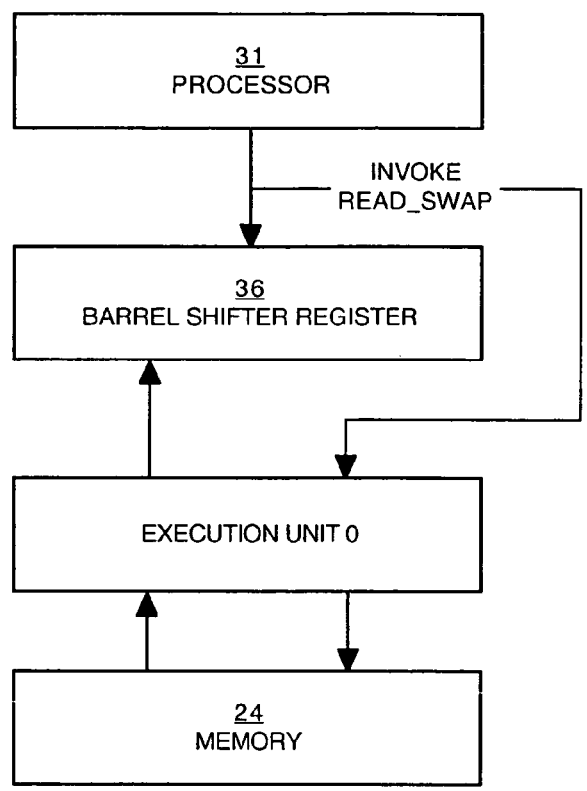
FIG. 4 is a data flow diagram for an instruction executed by a variable length decoder according to one embodiment of the present invention.

FIG. 4 is a data flow diagram associated with a first single instruction executed by a first execution unit of a variable length decoder according to one embodiment of the present invention. More specifically, FIG. 4 pertains to an operation, referred to herein as a read-swap operation, that is performed by execution unit 0 of VLD 12 (also see FIGS. 3A and 3B). The read-swap operation is optionally performed if the order of the data in the encoded bitstream 11 (FIGS. 3A and 3B) needs to be swapped, so that the data is ordered according to the endian mode used by the decoder 15 (FIG. 1).

In the example of FIG. 4, software processing portion 31 (hereinafter, processor 31) invokes the read-swap operation and, in response, execution unit 0 reverses the order of the bits in the encoded bitstream 11. More specifically, execution unit 0 reverses the order of the bits in the portion of the encoded bitstream 11 that is buffered in memory 24. In one embodiment, execution unit 0 operates on segments of bits in the encoded bitstream 11, to reverse the order of bits within each of the segments. This embodiment is further described by way of the following example.

Consider an example in which the encoded bitstream 11 includes the following data (in hexadecimal):

| A5 B4 C3 D2 | FF FF 15 00 | 00 55 67 88 | 56 FF FF FF |;
| ← 4 bytes → | ← 4 bytes → | ← 4 bytes → | ← 4 bytes → |.

In this example, there are four (4) segments of data, each segment 4 bytes in length. In one embodiment, the read-swap operation reverses the order of the bits (or bytes) within each segment, so that after a read-swap operation, the encoded bitstream 11 is ordered as follows:

| D2 C3 B4 A5 | 00 15 FF FF | 88 67 55 00 | FF FF FF 56 |;
| ← 4 bytes → | ← 4 bytes → | ← 4 bytes → | ← 4 bytes → |.

In one embodiment, in addition to the read-swap operation, execution unit 0 also removes stuffing bits (or bytes) from the encoded bitstream 11. In the above example, values of "FF" have been inserted into the encoded bitstream 11 as stuffing bytes. The stuffing bytes are identified as consecutive instances of "FF." Accordingly, repeated values of "FF" are removed from the bitstream where there are consecutive values of "FF," leaving the following modified bitstream:

D2 C3 B4 A5 00 15 FF 88 67 55 00 FF 56.

The operations described above are performed in a single processor (clock) cycle. That is, in one clock cycle, the order of bits can be swapped and stuffing code can be removed from the portion of the encoded bitstream being operated on.

In the present embodiment, the modified bitstream that is output from execution unit 0 is stored in barrel shifter register 36. If data from the preceding decode cycle remains in the barrel shifter register 36, the newer data is appended to the end of the preceding data. The barrel shifter register 36 can hold, for example, 64 bits of data; however, the present invention is not so limited. The size of the barrel shifter register 36 can be selected to maintain a fixed decoding rate and prevent underflow in the decoding pipeline.

Figure 5:
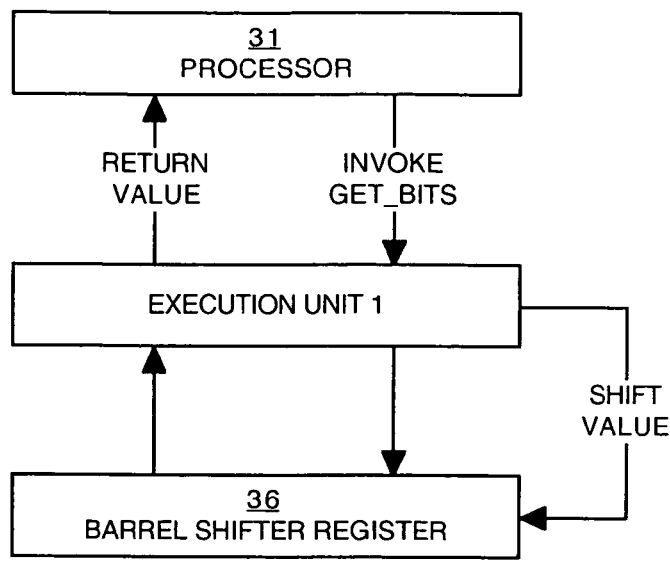
FIG. 5 is a data flow diagram for another instruction executed by a variable length decoder according to one embodiment of the present invention.

FIG. 5 is a data flow diagram for another instruction executed by a variable length decoder according to one embodiment of the present invention. More specifically, FIG. 5 pertains to an operation, referred to herein as a get-bits operation, that is performed by execution unit 1 of VLD 12 (also see FIGS. 3A and 3B).

In the example of FIG. 5, processor 31 invokes the get-bits operation, specifying a number K of bits to be returned by execution unit 1. In response, execution unit 1 extracts (reads and removes) the values of the specified number of bits from the stream of bits in the barrel shifter register 36. More specifically, execution unit 1 extracts the first K bits of the modified bitstream in the barrel shifter register 36 (modified in the sense that the bit order may have been swapped and stuffing code removed, as described above in conjunction with FIG. 4). Furthermore, the barrel shifter register 36 shifts (e.g., left-shifts) the stream of bits by the value of K (referred to in FIG. 4 as the shift value). This embodiment is further described by way of the following example.

Consider an example in which the following stream of bits is stored in the barrel shifter register 36 before the get-bits operation is invoked:

1101001101000001110011000 . . .

As an example, the get-bits operation specifies that five (5) bits are to be extracted from the above stream of bits. Accordingly, execution unit 1 extracts the bits 11010 from the above stream, and returns those bit values to processor 31. In addition, barrel shifter register 36 shifts the stream of bits to the left (with respect to the bit order above), so that after the get-bits operation, the following stream of bits is stored in barrel shifter register 36:

01101000001100011000 . . .

The operations described above are performed in a single processor (clock) cycle. That is, in one clock cycle, the specified number of bits is extracted (read and removed), and the bit stream is shifted.

Figure 6:
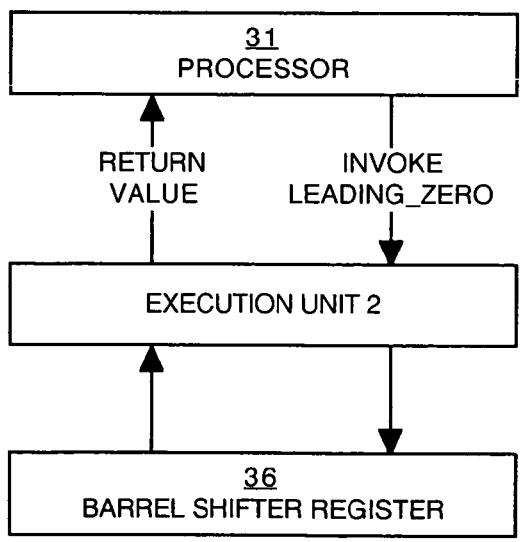
FIG. 6 is a data flow diagram for yet another instruction executed by a variable length decoder according to one embodiment of the present invention.

FIG. 6 is a data flow diagram for yet another instruction executed by a variable length decoder according to one embodiment of the present invention. More specifically, FIG. 6 pertains to an operation, referred to herein as a leading-zero operation, that is performed by execution unit 2 of VLD 12 (also see FIGS. 3A and 3B).

In the example of FIG. 6, processor 31 invokes the leading-zero operation. In response, execution unit 2 determines the number of zeros at the head of the stream of bits stored in the barrel shifter register 36. This embodiment is further described by way of the following example.

Consider an example in which the following stream of bits is stored in the barrel shifter register 36:

00010011010000011 . . .

In this example, execution unit 2 determines that the leading number of zeros is 3, and returns this value to the processor 31. The stream of bits in the barrel shifter register 36 is the same before and after the leading-zero operation is performed.

The operations described above are performed in a single processor (clock) cycle. That is, in one clock cycle, the leading number of zeros is identified to the processor 31.

To summarize, the execution units 0, 1 and 2 of FIGS. 4, 5 and 6, as well as execution unit 3 of FIG. 3B, perform single-cycle instructions that accomplish complex tasks that conventionally require multiple (perhaps a hundred or more) processor instructions.

In one embodiment, a first, a second and a third single instruction are created and executed in hardware using a configurable processor (e.g., acceleration hardware portion 32 of FIG. 3A). These single instructions accomplish the following variable length decoding functions: swap the order of bits in a bitstream to accommodate the decoder's endian mode; strip out stuffing code from a bitstream; extract (get or read and remove) a specific number of bits from a bitstream; and determine the number of consecutive (leading) zeros in a bitstream. In one such embodiment, using the information provided by these instructions, a software processing portion 31 executes a software procedure that locates a codeword (e.g., a VLC) in an LUT. Subsequent to the execution of the first, second and third instructions, the lookup can be performed in a manner known in the art.

In another embodiment, as discussed above in conjunction with FIG. 3B, the lookup may be performed in hardware, using execution unit 3.

Figure 7:
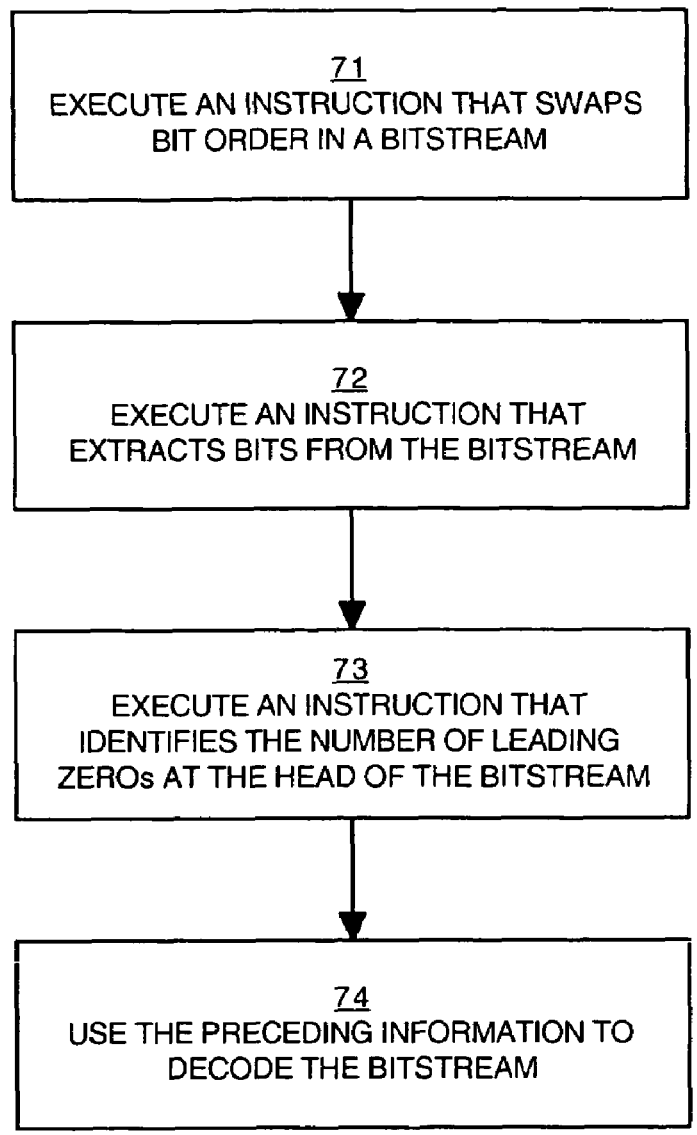
FIG. 7 is a flowchart of a computer-implemented method for variable length decoding according to one embodiment of the present invention.

FIG. 7 is a flowchart 70 of a computer-implemented method for variable length decoding according to one embodiment of the present invention. Although specific steps are disclosed in flowchart 70, such steps are exemplary. That is, the present invention is well-suited to performing various other steps or variations of the steps recited in flowchart 70. It is appreciated that the steps in flowchart 70 may be performed in an order different than presented and that the steps in flowchart 70 are not necessarily performed in the sequence illustrated. In general, the steps in flowchart 70 are by MPU 22 of FIG. 2; more specifically, the steps are performed by software processing portion 31 and acceleration hardware portion 32 of the VLD 12 of FIGS. 3A and 3B.

In block 71 of FIG. 7, in one embodiment, a first single instruction (e.g., a read-swap operation) is optionally executed. With reference also to FIGS. 3A and 3B, the first single instruction reverses the order of bits in an encoded bitstream (e.g., encoded bitstream 11) to produce a modified bitstream that is stored in a memory (e.g., barrel shifter register 36). The first single instruction may operate on a segment of the encoded bitstream, to reverse the order of bits within that segment. In one embodiment, the first single instruction also removes stuffing code from the encoded bitstream. In one embodiment, the first single instruction is executed in a single clock cycle.

In block 72 of FIG. 7, in one embodiment, a second single instruction (e.g., a get-bit operation) is executed. The second single instruction extracts a specified number of bits from the modified bitstream (e.g., the bitstream in the barrel shifter register 36 of FIGS. 3A and 3B). In one embodiment, as a result of the second single instruction, the bitstream in the barrel shifter register 36 is shifted by the specified number of bits. In one embodiment, the second single instruction is executed in a single clock cycle.

In block 73 of FIG. 7, in one embodiment, a third single instruction (e.g., a leading-zero operation) is executed. The third single instruction identifies a number of consecutive zero bit values at the head of the modified bitstream (e.g., the bitstream in the barrel shifter register 36 of FIGS. 3A and 3B). In one embodiment, the third single instruction is executed in a single clock cycle.

In block 74 of FIG. 7, in one embodiment, the results produced by executing the first, second and third instructions are used in the process of decoding the encoded bitstream. That is, for example, the information parsed from the encoded bitstream by the get-bit and leading-zero operations, in combination with the read-swap operation, can be used by a processor 31 (FIG. 3A) to locate a VLC in an LUT, where associated with the VLC is the decoded codeword. Alternatively, information parsed from the encoded bitstream can be used by execution unit 3 (FIG. 3B) to locate a VLC in an LUT, where associated with the VLC is a memory address for a location that holds the decoded codeword associated with the VLC.

In summary, according to embodiments of the present invention, many processor instructions are replaced by a number of specific, single-cycle instructions in a VLD. Consequently, the number of processor (execution) cycles needed for variable length decoding can be substantially reduced relative to conventional VLDs. Reductions in processor cycles of 35-50 percent have realized. By accelerating VLD performance, processing speeds can be increased. Alternatively, with a faster VLD, current levels of performance can be maintained using fewer processor cycles.

In a sense, according to embodiments of the present invention, the flow of information through a conventional software-based process is intercepted at some point in the process, and the information is diverted to hardware-based execution units that perform the operations described above, in lieu of performing those operations in software. The outputs of the execution units can then be injected back into the software-based process. Significantly, both the diversion of information from the software-based process, and the reinsertion of the information back into the software-based process, is achieved in a seamless manner that is transparent to the software.

Embodiments of the present invention are thus described. While the present invention has been described in particular embodiments, it should be appreciated that the present invention should not be construed as limited by such embodiments, but rather construed according to the below claims.

What is claimed is:

1. A system for variable length decoding, said system comprising:
   a first execution unit operable for executing a first single instruction that optionally reverses the order of bits in an encoded bitstream according to an endian mode;
   a register that receives an output bitstream from said first execution unit;
   a second execution unit coupled to said register, said second execution unit operable for executing a second single instruction that extracts a specified number of bits from said output bitstream; and
   a third execution unit coupled to said register, said third execution unit operable for executing a third single instruction that identifies a number of consecutive zero bit values at the head of said output bitstream, wherein outputs of said first, second and third execution units are used in decoding said encoded bitstream.

2. The system of claim 1 wherein said first, second and third single instructions each execute in a single clock cycle.

3. The system of claim 1 wherein said first single instruction also removes stuffing code from said encoded bitstream.

4. The system of claim 1 further comprising a processor that uses said outputs to index a codeword in a memory-stored lookup table, said codeword used in said decoding of said encoded bitstream.

5. The system of claim 1 further comprising a fourth execution unit coupled to said register, said fourth execution unit operable for reading a specified number of bits from said output bitstream and using said bits to look up a memory address in a lookup table, said memory address for locating a decoded codeword.

6. The system of claim 1 wherein said first single instruction operates on segments of bits in said encoded bitstream to reverse the order of bits within each of said segments.

7. The system of claim 1 wherein said register comprises a barrel shifter and wherein after execution of said second single instruction to extract said specified number of bits, said output bitstream is shifted by said specified number.

8. A computer processor-implemented method for variable length decoding, said method comprising:
   executing a first single instruction that optionally reverses bit order in an encoded bitstream according to an endian mode to produce a modified bitstream;
   executing a second single instruction that extracts a specified number of bits from said modified bitstream;
   executing a third single instruction that identifies a number of consecutive zero bit values at the head of said modified bitstream; and
   using results from said first, second and third single instructions in decoding said encoded bitstream.

9. The method of claim 8 wherein said first, second and third single instructions each execute in a single clock cycle of said processor.

10. The method of claim 8 wherein said executing said first single instruction further comprises removing stuffing code from said encoded bitstream.

11. The method of claim 8 further comprising indexing a codeword in a memory-resident lookup table according to said outputs, wherein said codeword is used in said decoding of said encoded bitstream.

12. The method of claim 8 wherein said executing said first single instruction further comprises:
selecting a segment of bits in said encoded bitstream; and reversing bit order within said segment.

13. The method of claim 8 wherein said executing said second single instruction further comprises shifting said modified bitstream by said specified number in a barrel shifter.

14. A device comprising:
a memory for storing an encoded bitstream; and
a media processor unit (MPU) coupled to said memory and comprising a hardware portion customized for encoded bitstream decoding and a processor portion;
said hardware portion operable for executing a plurality of instructions that implement variable length decoding operations, said operations comprising a read-swap operation that optionally reverses the order of bits in said encoded bitstream according to an endian mode to produce a modified bitstream, a get-bits operation that extracts a specified number of bits from said modified bitstream, and a leading-zero operation that identifies a number of consecutive zero bit values at the head of said modified bitstream, wherein each of said operations is performed in a single clock cycle;
said processor portion operable for using values returned by said operations for parsing and interpreting said encoded bitstream.

15. The device of claim 14 wherein said read-swap operation further comprises removing stuffing code from said encoded bitstream.

16. The device of claim 14 wherein said processor portion locates a codeword in a memory-resident lookup table, said codeword used in said decoding of said encoded bitstream.

17. The device of claim 14 wherein said read-swap operation operates on segments of bits in said encoded bitstream to reverse the order of bits within each of said segments.

18. The device of claim 14 wherein said hardware portion is also operable for reading a specified number of bits from said modified bitstream and using said bits to look up a memory address in a lookup table, said memory address for locating a decoded codeword.

19. The device of claim 18 further comprising a barrel shifter register for storing said modified bitstream, wherein after execution of said get-bits operation, said modified bitstream is shifted by said specified number.

20. The device of claim 14 further comprising:
a host processor coupled to said MPU; and
a display device coupled to said MPU.

* * * * *